US009437588B1

(12) United States Patent
Zeng et al.

(10) Patent No.: US 9,437,588 B1
(45) Date of Patent: Sep. 6, 2016

(54) MIDDLE OF-LINE ARCHITECTURE FOR DENSE LIBRARY LAYOUT USING M0 HAND-SHAKE

(71) Applicant: GLOBALFOUNDRIES Inc., Grand Cayman (KY)

(72) Inventors: Jia Zeng, Sunnyvale, CA (US); Jongwook Kye, Pleasanton, CA (US); Harry J. Levinson, Saratoga, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/742,935

(22) Filed: Jun. 18, 2015

(51) Int. Cl.
| | |
|---|---|
| *H01L 29/66* | (2006.01) |
| *H01L 27/02* | (2006.01) |
| *H01L 21/8234* | (2006.01) |
| *H01L 21/768* | (2006.01) |
| *H01L 23/528* | (2006.01) |
| *H01L 23/522* | (2006.01) |
| *H01L 27/088* | (2006.01) |

(52) U.S. Cl.
CPC ..... *H01L 27/0207* (2013.01); *H01L 21/76802* (2013.01); *H01L 21/76877* (2013.01); *H01L 21/76886* (2013.01); *H01L 21/823475* (2013.01); *H01L 23/5226* (2013.01); *H01L 23/5283* (2013.01); *H01L 23/5286* (2013.01); *H01L 27/088* (2013.01); *H01L 29/66545* (2013.01)

(58) Field of Classification Search
CPC ............. H01L 21/76886; H01L 23/5283; H01L 27/088; H01L 29/66477
USPC .......................................................... 438/197
See application file for complete search history.

(56) References Cited

U.S. PATENT DOCUMENTS

2015/0008524 A1* 1/2015 Hung .................... H01L 27/088
257/368

* cited by examiner

*Primary Examiner* — Tran Tran
(74) *Attorney, Agent, or Firm* — Ditthavong & Steiner, P.C.

(57) ABSTRACT

A dense library architecture using an M0 hand-shake and the method of forming the layout are disclosed. Embodiments include forming first and second active areas on a substrate, at the top and bottom of a cell, separated from each other; forming first through third gate lines perpendicular to the active areas, where the first and third gate lines are dummy gates at the cell edges; forming trench silicide segments on each of the active areas, between the first, second, and third gate lines; forming first and second M1 metal lines between the first and second gate lines and the second and third gate lines, respectively; forming a M0 segment between the first and second active regions perpendicular to the M1 metal lines; forming a CB between the M0 segment and the second gate line; and forming a V0 from the first metal line to the M0 segment.

13 Claims, 4 Drawing Sheets

BACKGROUND

BACKGROUND

BACKGROUND

MIDDLE OF-LINE ARCHITECTURE FOR DENSE LIBRARY LAYOUT USING M0 HAND-SHAKE

TECHNICAL FIELD

The present disclosure relates to semiconductor layouts. The present disclosure is particularly applicable to semiconductor layouts for the 10 nanometer (nm) technology node and beyond.

BACKGROUND

A traditional dense library layout does not include trench silicide and metal zero (M0) layers. Instead, as illustrated in FIG. 1A, active area contacts (CAs) 101 are used as vertical local interconnects, for example connecting power rails 103 and 105 to active areas 107 and 109, respectively, and the metal 1 (M1) layer includes bidirectional routing (111) for connecting active area 107 to active area 109. In this architecture, a CA 101 is formed between adjacent gate lines 113, metal line 115 and power rails 103 and 105 are part of the M1 layer, a gate contact (CB) 117 connects metal line 115 to an underlying gate line 113, and vias (V0) 119 connect the M1 layer to CAs 101.

Recently, a trench silicide and a metal 0 (M0) layer have been introduced to the traditional architecture to relieve some of the M1 congestion and improve pin accessibility. For example, as illustrated in FIG. 1B, a trench silicide 121 is formed between adjacent gate lines 113, CA 123 connects trench silicide 121 with M0 125 (which is formed below and perpendicular to M1 metal lines 115), and V0 127 connects M0 to metal line 115. Further, metal segments 103 and 105, previously used alone as power-rails, connect through a V0 119 to M0 segments 129, which are used as additional power-rails. As the horizontal routing occurs on the M0 level, which is below M1, congestion at the M1 level is reduced.

However, as illustrated in the top portion of FIG. 1C, at the cell boundary, V0 and M0 must satisfy certain enclosure rules, in which M0 must extend far enough beyond the edge of V0 to ensure proper connection between the two, as the ends of M0 may become rounded during printing. Concurrently, M0 must maintain a reasonable tip-to-tip (T2T) distance 131 for manufacturability, particularly for smaller technology nodes. To satisfy T2T requirements, M0 could be formed wider as shown in the bottom portion of FIG. 1C, such that the distance 133 becomes a side-to-side (S2S) distance. Further, a smaller enclosure can be tolerated when the metal becomes wider. Since printing primarily affects the end or tip of a metal segment, V0 and M0 can tolerate a zero enclosure (in which the edge of M0 aligns with the edge of V0) at the sides if M0 is formed as a vertical line. (Although a zero enclosure is illustrated in FIG. 1C for illustrative purposes, since M0 is not yet a vertical line in this example, in reality a small enclosure would still be required.) However, a wider M0 takes up more space, and, therefore, creates congestion on the M0 level for more complicated cells, and specifically for dense library cells (i.e., cells with 9 tracks and below). In the cases of tall cells, such as with 12 tracks and beyond, this is not a concern, as there are no strict density requirements, and layout engineers can just increase the cell height or slip dummy gate lines at the cell boundary to satisfy any design rules.

A need therefore exists for methodology enabling connections between two active regions and between a metal line and a gate line without violating V0/M0 enclosure rules and with sufficient T2T distance for dense library cells, and the resulting device.

SUMMARY

An aspect of the present disclosure is a method of forming a semiconductor layout with no conflict between a V0/M0 enclosure rule and an M0 tip-to-tip minimum distance by forming M1 metal lines between gate lines and including a DDB.

Another aspect of the present disclosure is a device with no conflict between a V0/M0 enclosure rule and an M0 tip-to-tip minimum distance by forming M1 metal lines between gate lines and including a DDB.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first and second active areas on a substrate, at top and bottom sides of a cell, separated from each other; forming first, second, and third gate lines perpendicular to the active areas, where the first and third gate lines are dummy gates at the edges of the cell; forming trench silicide segments on each of the first and second active areas, between the first, second, and third gate lines; forming first and second M1 metal lines between the first and second gate lines and the second and third gate lines, respectively; forming a M0 segment between the first and second active regions perpendicular to the M1 metal lines; forming a gate contact between the M0 segment and the second gate line; and forming a V0 from the first metal line to the M0 segment.

Aspects of the present disclosure include forming a second V0 connecting one end of the second metal line with a CA connected to a trench silicide segment in the first active area; and forming a third V0 connecting a second end of the second metal line with a CA connected to a trench silicide in the second active area, wherein the first active area is connected to the second active area. (It seems CA is missing here: CA square is on top of TS, V0 is on top of CA, so V0 is actually connection CA and M1) Further aspects include forming fourth, fifth, and sixth gate lines between the second and third gate lines, the second metal line being between the fifth and sixth gate lines; forming third, fourth, and fifth, M1 metal lines between the second and fourth, fourth and fifth, and sixth and third gate lines, respectively; and forming second, third, and fourth M0 segments perpendicular to the M1 metal lines, in a zig-zag pattern with the first M0 segment, between the first and second active areas. Other aspects include forming second, third, and fourth V0s from the third, fourth, and fifth M1 metal lines down to the second, third, and fourth, M0 segments, respectively, and forming second, third, and fourth gate contacts between the second, third, and fourth M0 segments and the fourth, fifth, and sixth gate lines, respectively. Additional aspects include forming a fifth V0 connecting one end of the second metal line with a CA connected to a trench silicide in the first active area; forming a sixth V0 connecting a second end of the second metal line with a CA connected to a trench silicide in the second active area; and forming a M0 line perpendicular to the M1 metal lines, over the CA's in the first active area. Another aspect includes forming each of the first, second, third, and fourth gate contacts prior to the first, second, third, and fourth M0 segments; and forming the first, second, third, and fourth metal zero segments around edges of the first, second, third, and fourth gate contacts. A further aspect includes forming two M0 segments as first and second power rails along top and bottom edges of the cell, perpendicular to the gate lines.

Another aspect of the present disclosure is a device including first and second active areas on a substrate, at top and bottom sides of a cell, separated from each other; first, second, and third gate lines perpendicular to the active areas, where the first and third gate lines are dummy gates at the edges of the cell; trench silicide segments on each of the first and second active areas, between the first, second, and third gate lines; first and second M1 metal lines between the first and second gate lines and the second and third gate lines, respectively; a M0 segment between the first and second active regions perpendicular to the M1 metal lines; a gate contact between the M0 segment and the second gate line; and a V0 from the first metal line to the M0 segment.

Aspects include a second V0 connecting one end of the second metal line with a CA connected to a trench silicide segment in the first active area; and a third V0 connecting a second end of the second metal line with a CA connected to a trench silicide in the second active area, wherein the first active area is connected to the second active area. Further aspects include fourth, fifth, and sixth gate lines between the second and third gate lines, the second metal line being between the fifth and sixth gate lines; third, fourth, and fifth, M1 metal lines between the second and fourth, fourth and fifth, and sixth and third gate lines, respectively; and second, third, and fourth M0 segments perpendicular to the M1 metal lines, in a zig-zag pattern with the first M0 segment, between the first and second active areas. Additional aspects include second, third, and fourth V0s from the third, fourth, and fifth M1 metal lines down to the second, third, and fourth, M0 segments, respectively, and second, third, and fourth gate contacts between the second, third, and fourth M0 segments and the fourth, fifth, and sixth gate lines, respectively. Further aspects include a fifth V0 connecting one end of the second metal line with a CA connected to a trench silicide in the first active area; a sixth V0 connecting a second end of the second metal line with a CA connected to a trench silicide in the second active area; and a M0 line perpendicular to the M1 metal lines, over the CA's in the first active area. Additional aspects include the first, second, third, and fourth metal zero segments being formed touching sides of the first, second, third, and fourth gate contacts and satisfying a zero enclosure rule. Other aspects include two M0 segments as first and second power rails along top and bottom edges of the cell, perpendicular to the gate lines.

Another aspect of the present disclosure is a method including forming first and second active areas on a substrate, at top and bottom sides of a first cell, separated from each other and third and fourth active areas on the substrate, at top and bottom sides of a second cell, separated from each other; forming a first gate line in the first cell perpendicular to the active areas and a second gate line in the second cell perpendicular to the active areas; forming a double diffusion break between the first and second cells; forming trench silicide segments on each of the first, second, third, and fourth active areas, on opposite sides of each of the first and second gate lines; forming first and second M1 metal lines and third and fourth M1 metal lines on opposite sides of the first and second gate lines, respectively; forming a first M0 segment between the first and second active areas perpendicular to the M1 metal lines and a second M0 segment between the third and fourth active areas perpendicular to the M1 metal lines; forming a first gate contact between the first M0 segment and the first gate line and a second gate contact between the second M0 segment and the second gate line; forming a first V0 from the first metal line to the first M0 segment and a second V0 from the fourth metal line to the second M0 segment; and forming two M0 segments as first and second power rails along top and bottom edges of the first and second cells, perpendicular to the gate lines.

Aspects include forming a third V0 connecting one end of the second metal line with a CA connected to a trench silicide segment in the first active area; forming a fourth V0 connecting a second end of the second metal line with a CA connected to a trench silicide in the second active area; forming a fifth V0 connecting one end of the third metal line with a CA connected to a trench silicide segment in the third active area; forming a sixth V0 connecting a second end of the third metal line with a CA connected to a trench silicide in the fourth active area; wherein the first and second active areas and the third and fourth active areas are respectively connected. Further aspects include additional gate lines between the first gate line and the double diffusion break and between the second gate line and the double diffusion break; forming an additional metal line between each pair of adjacent additional gate lines and between the double diffusion break and each adjacent additional gate line; and forming additional M0 segments perpendicular to the M1 metal lines, in a zig-zag pattern with respect to the first M0 segment, between the first and second active areas and in a zig-zag pattern with respect to the second M0 segment, between the third and fourth active areas. Other aspects include forming an additional V0 from each additional metal line down to an additional M0 segment, and forming an additional gate contact between each of the additional M0 segments and an underlying gate line. Another aspect includes forming each of the gate contacts prior to the M0 segments; and forming the metal zero segments around edges of the gate contacts.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of the V0/M0 enclosure rule conflicting with M0 tip-to-tip required distances attendant upon forming adjacent cells with a traditional M0 architecture. In accordance with embodiments of the present disclosure, M1 metal lines are aligned between gate lines, a double diffusion break is formed at the cell boundaries, and an M0 segment enables a handshake between V0 and CB.

Methodology in accordance with embodiments of the present disclosure includes forming first and second active areas on a substrate, at top and bottom sides of a cell, separated from each other. First, second, and third gate lines are formed perpendicular to the active areas, where the first and third gate lines are dummy gates at the edges of the cell. Trench silicide segments are formed on each of the first and second active areas, between the first, second, and third gate lines, and first and second M1 metal lines are formed between the first and second gate lines and the second and third gate lines, respectively. A M0 segment is formed between the first and second active regions perpendicular to the M1 metal lines. A CB is formed between the M0 segment and the second gate line; and a V0 is formed from the first metal line to the M0 segment.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
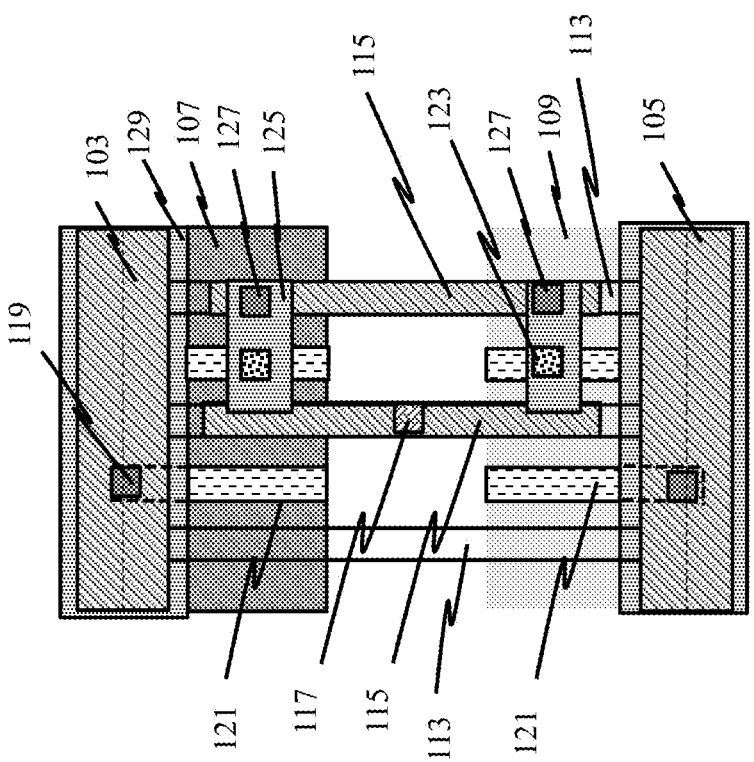
FIGS. 1A and 1B schematically illustrate traditional dense library layouts, without and with TS and M0 layers, respectively.
Figure 1A:
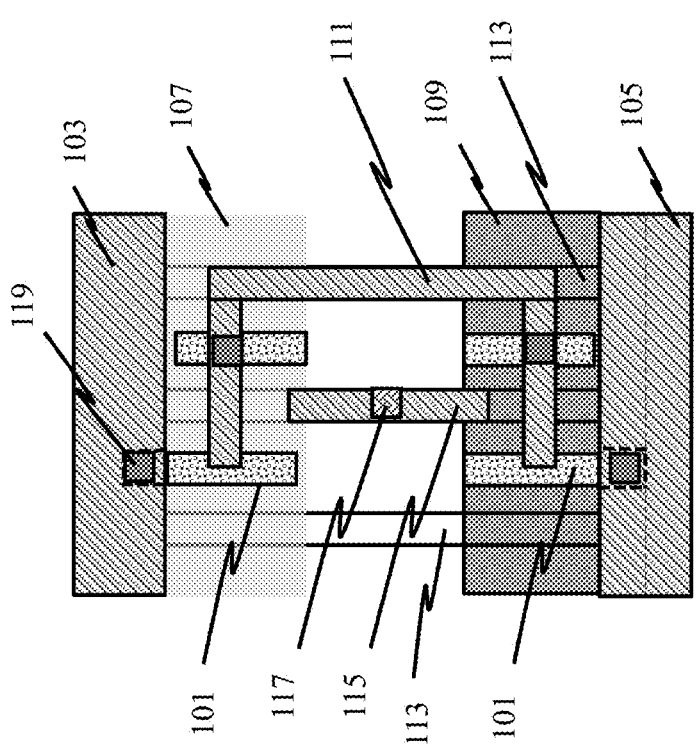
Figure 1C:
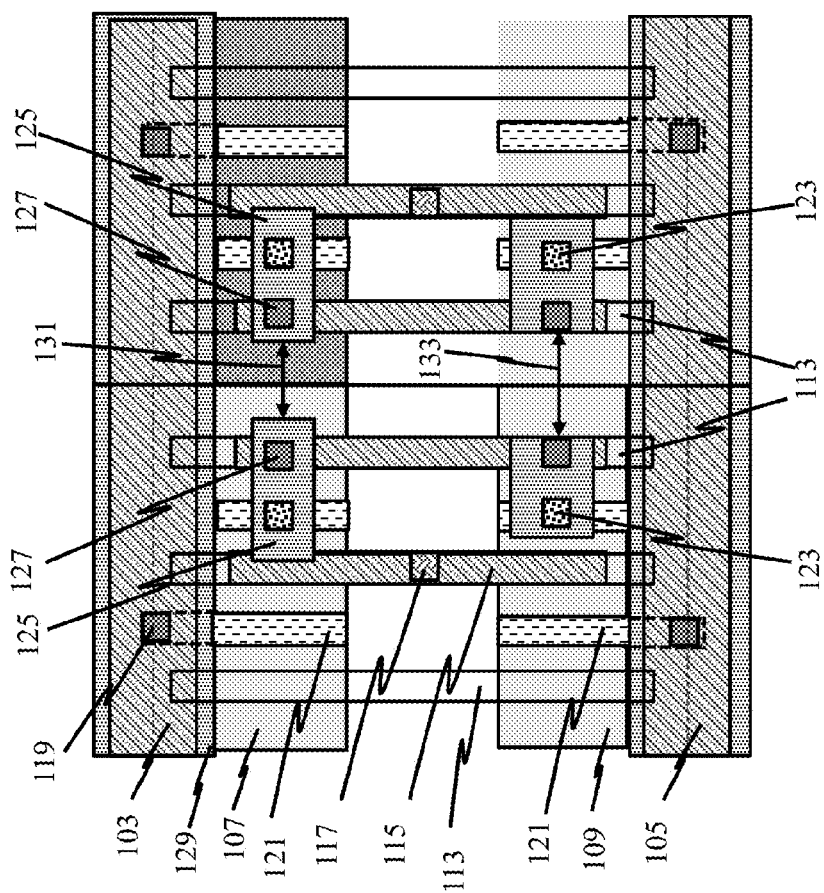
FIG. 1C schematically illustrates side-by-side cells with the traditional dense library layout with an M0 layer.
Figure 2B:
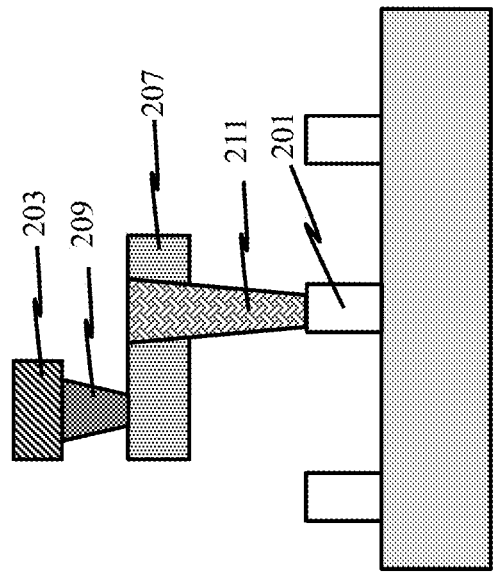
FIGS. 2A and 2B schematically illustrate top and cross-sectional views, respectively, of an M0 hand-shake architecture, in accordance with an exemplary embodiment.
Figure 2A:
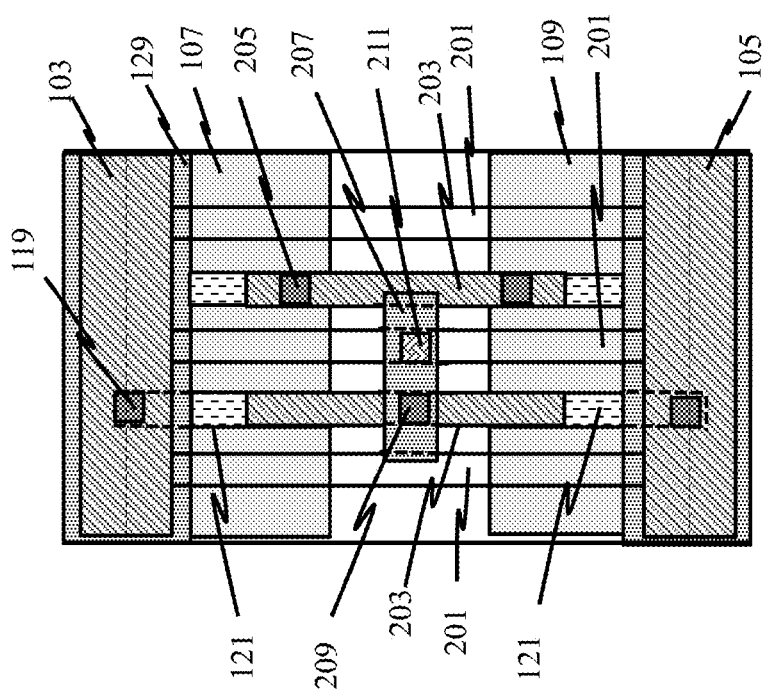

FIGS. 2A and 2B schematically illustrate a layout and cross-sectional view, respectively, of an M0 handshake architecture, in accordance with an exemplary embodiment. Adverting to FIGS. 2A and 2B, metal segments 103 and 105, active areas 107 and 109, V0 119, trench silicide 121, and M0 power-rails 129 are the same as FIG. 1B. Gate lines 201 are formed similar to gate lines 113, with the gate lines at the boundaries of the cell being dummy gates, forming a double diffusion break DDB between two adjacent cells. In contrast to FIG. 1B, however, M1 metal lines 203 are formed over the trench silicide, between gate lines rather than over the gate lines. CA's (not shown for illustrative convenience) formed on trench silicide 121 and V0's 205 formed over the CA's connect trench silicide 121 with metal line 203 such that V0's 205, the CA's, trench silicide 121, and metal line 203 connect active area 107 with active area 109. For the gate line to metal line connection, an M0 handshake is created. Specifically, M0 207 is formed horizontally over metal line 203 and extending past gate line 201. V0 209 connects metal line 203 to M0 207. Further, CB 211 connects gate line 113 to M0 207. With the DDB and the M0 handshake (with M1 metal lines being aligned between the gate lines), the V0/M0 enclosure rule and M0 T2T concern no longer conflict.

Figures 3A, 3B:
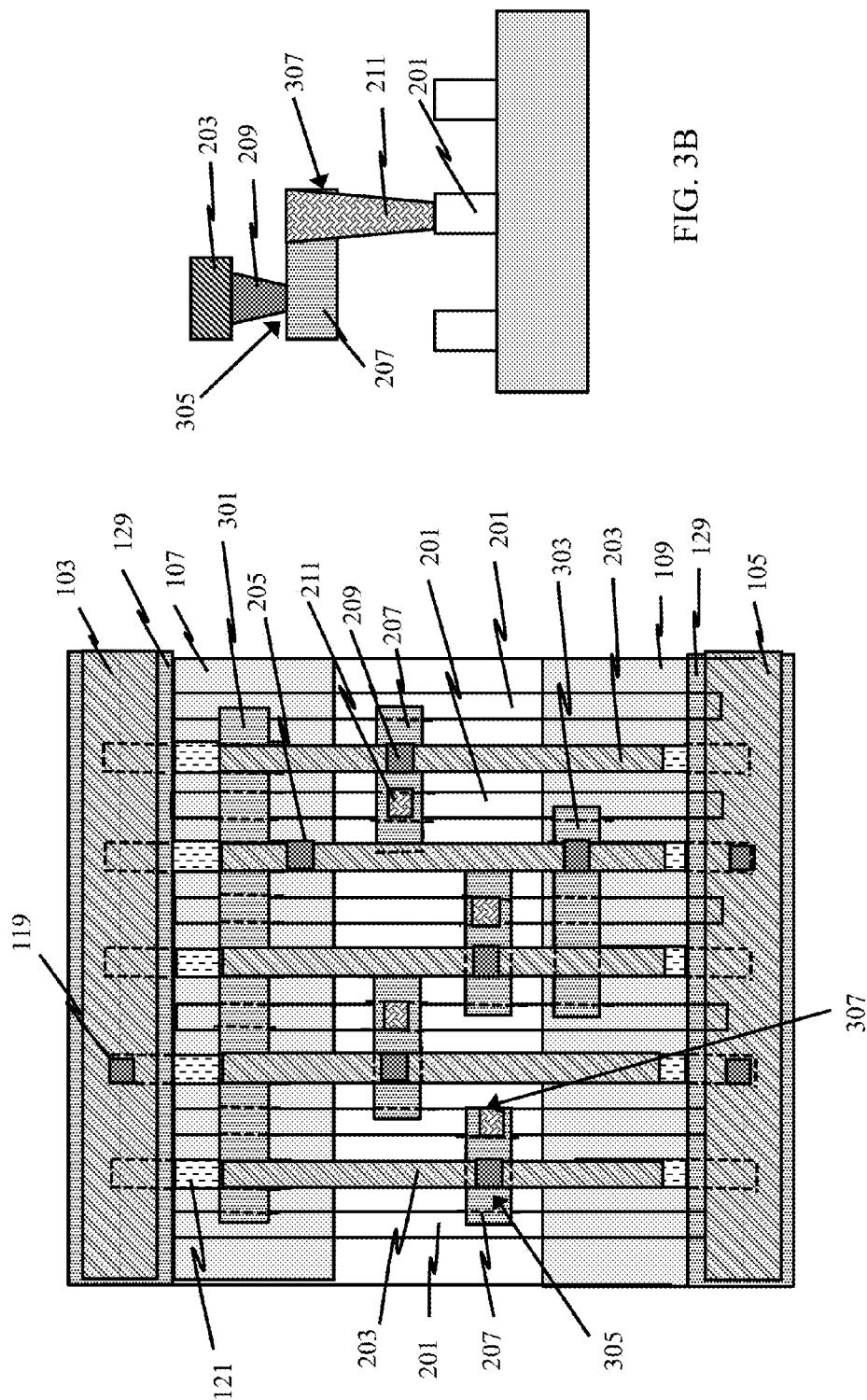
FIG. 3A schematically illustrates a top view of a zig-zag M0 hand-shake architecture multiple gate line connections, in accordance with an exemplary embodiment.
FIG. 3B schematically illustrates a cross-sectional view of a top-down enclosure versus a side-touch enclosure, in accordance with an exemplary embodiment.

As illustrated in FIGS. 3A and 3B, for more complicated cells than that shown in FIGS. 2A and 2B, multiple connections may be necessary between M1 metal lines and gate lines. With the M0 handshake architecture of FIGS. 2A and 2B, CBs 211, and consequently M0 segments 207, may be formed in a zig-zag pattern in the area between active areas 107 and 109 to increase the number of connections between gate lines and M1 metal lines. Other M0 segments may also be required in a more complicated cell, such as that shown in FIG. 3A. For example, M0 line 301, across all of the trench silicide segments on active area 107 with a CA (not shown for illustrative convenience) between M0 line 301 and each trench silicide segment 121, or M0 segment 303 over a couple of trench silicide segments on active area 109 with a CA (not shown for illustrative convenience) between M0 segment 303 and each trench silicide segment 121.

In addition, although edge placement tolerance is required when forming V0 209, since V0 209 is formed over M0 207 as a top-down overlap as shown at 305, the edge of M0 is far enough from the cell edge that the V0/M0 enclosure rule and the M0 tip-to-tip concern no longer conflict. However, the M0 segments 207 are formed after the CB 211, such that M0 207 may be formed to touch the sides of CB 211, rather than as a top-down overlap. As a result of the side-touch, a zero enclosure can be tolerated. Accordingly, as illustrated at 307, a zero enclosure will suffice.

The embodiments of the present disclosure can achieve several technical effects, such as eliminating conflicts between V0/M0 enclosure rules and M0 tip-to-tip minimum distances at cell boundaries. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices by way of a self-aligned double patterning process, particularly for the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
   forming first and second active areas on a substrate, at top and bottom sides of a cell, separated from each other;

forming first, second, and third gate lines perpendicular to the active areas, where the first and third gate lines comprise dummy gates at the edges of the cell;

forming trench silicide segments on each of the first and second active areas, between the first, second, and third gate lines;

forming first and second M1 metal lines between the first and second gate lines and the second and third gate lines, respectively;

forming a metal 0 (M0) segment between the first and second active regions perpendicular to the M1 metal lines;

forming a gate contact (CB) between the M0 segment and the second gate line; and forming a via (V0) from the first metal line to the M0 segment.

2. The method according to claim 1, further comprising forming a second V0 connecting one end of the second metal line with an active area contact (CA) connected to a trench silicide segment in the first active area; and forming a third V0 connecting a second end of the second metal line with a CA connected to a trench silicide in the second active area, wherein the first active area is connected to the second active area.

3. The method according to claim 1, further comprising:

fourth, fifth, and sixth gate lines between the second and third gate lines, the second metal line being between the fifth and sixth gate lines;

forming third, fourth, and fifth, M1 metal lines between the second and fourth, fourth and fifth, and sixth and third gate lines, respectively; and forming second, third, and fourth M0 segments perpendicular to the M1 metal lines, in a zig-zag pattern with the first M0 segment, between the first and second active areas.

4. The method according to claim 3, further comprising:

forming second, third, and fourth V0s from the third, fourth, and fifth M1 metal lines down to the second, third, and fourth, M0 segments, respectively, and forming second, third, and fourth CBs between the second, third, and fourth M0 segments and the fourth, fifth, and sixth gate lines, respectively.

5. The method according to claim 4, further comprising:

forming a fifth V0 connecting one end of the second metal line with a CA connected to a trench silicide in the first active area;

forming a sixth V0 connecting a second end of the second metal line with a CA connected to a trench silicide in the second active area; and forming a M0 line perpendicular to the M1 metal lines, over the CA's in the first active area.

6. The method according to claim 5, further comprising forming each of the first, second, third, and fourth CBs prior to the first, second, third, and fourth M0 segments; and forming the first, second, third, and fourth metal zero segments around edges of the first, second, third, and fourth CBs.

7. The method according to claim 1, further comprising forming two M0 segments as first and second power rails along top and bottom edges of the cell, perpendicular to the gate lines.

8. A method comprising:

forming first and second active areas on a substrate, at top and bottom sides of a first cell, separated from each other and third and fourth active areas on the substrate, at top and bottom sides of a second cell, separated from each other;

forming a first gate line in the first cell perpendicular to the active areas and a second gate line in the second cell perpendicular to the active areas;

forming a double diffusion break between the first and second cells;

forming trench silicide segments on each of the first, second, third, and fourth active areas, on opposite sides of each of the first and second gate lines;

forming first and second M1 metal lines and third and fourth M1 metal lines on opposite sides of the first and second gate lines, respectively;

forming a first metal 0 (M0) segment between the first and second active areas perpendicular to the M1 metal lines and a second M0 segment between the third and fourth active areas perpendicular to the M1 metal lines;

forming a first gate contact (CB) between the first M0 segment and the first gate line and a second CB between the second M0 segment and the second gate line;

forming a first via (V0) from the first metal line to the first M0 segment and a second V0 from the fourth metal line to the second M0 segment; and forming two M0 segments as first and second power rails along top and bottom edges of the first and second cells, perpendicular to the gate lines.

9. The method according to claim 8, comprising:

forming a third V0 connecting one end of the second metal line with an active area contact (CA) connected to a trench silicide segment in the first active area;

forming a fourth V0 connecting a second end of the second metal line with a CA connected to a trench silicide in the second active area;

forming a fifth V0 connecting one end of the third metal line with a CA connected to a trench silicide segment in the third active area;

forming a sixth V0 connecting a second end of the third metal line with a CA connected to a trench silicide in the fourth active area;

wherein the first and second active areas and the third and fourth active areas are respectively connected.

10. The method according to claim 8, further comprising:

additional gate lines between the first gate line and the double diffusion break and between the second gate line and the double diffusion break;

forming an additional metal line between each pair of adjacent additional gate lines and between the double diffusion break and each adjacent additional gate line; and forming additional M0 segments perpendicular to the M1 metal lines, in a zig-zag pattern with respect to the first M0 segment, between the first and second active areas and in a zig-zag pattern with respect to the second M0 segment, between the third and fourth active areas.

11. The method according to claim 10, further comprising:

forming an additional V0 from each additional metal line down to an additional M0 segment, and forming an additional CB between each of the additional M0 segments and an underlying gate line.

12. The method according to claim 11, further comprising:

forming a third V0 connecting one end of the second metal line with a CA connected to a trench silicide segment in the first active area;

forming a fourth V0 connecting a second end of the second metal line with a CA connected to a trench silicide in the second active area;

forming a fifth V0 connecting one end of the third metal line with a CA connected to a trench silicide segment in the third active area;

forming a sixth V0 connecting a second end of the third metal line with a CA connected to a trench silicide in the fourth active area;

wherein the first and second active areas and the third and fourth active areas are respectively connected.

13. The method according to claim 12, further comprising forming each of the CBs prior to the M0 segments; and forming the metal zero segments around edges of the CBs.

* * * * *